(12) United States Patent
Lobeek

(10) Patent No.: US 7,230,510 B2
(45) Date of Patent: Jun. 12, 2007

(54) DUPLEXER AND METHOD OF ISOLATING AN RX-BAND AND A TX-BAND

(75) Inventor: Jan-Willem Lobeek, Nijmegen (NL)

(73) Assignee: NXP B. V., Eindhoven (NL)

( * ) Notice: Subject to any disclaimer, the term of this patent is extended or adjusted under 35 U.S.C. 154(b) by 117 days.

(21) Appl. No.: 10/535,055

(22) PCT Filed: Oct. 31, 2003

(86) PCT No.: PCT/IB03/04905

§ 371 (c)(1),
(2), (4) Date: May 13, 2005

(87) PCT Pub. No.: WO2004/047290

PCT Pub. Date: Jun. 3, 2004

(65) Prior Publication Data

US 2006/0055485 A1   Mar. 16, 2006

(30) Foreign Application Priority Data

Nov. 19, 2002 (EP) .................................. 02079794

(51) Int. Cl.
H03H 9/70 (2006.01)
(52) U.S. Cl. ...................................... 333/133; 333/132

(58) Field of Classification Search ................. 333/133
See application file for complete search history.

(56) References Cited

U.S. PATENT DOCUMENTS

| 1,795,204 | A | * | 3/1931 | Espenschied ............... 333/189 |
| 3,293,644 | A |   | 12/1966 | Loos et al. |
| 5,789,845 | A | * | 8/1998 | Wadaka et al. .............. 310/334 |
| 6,081,171 | A | * | 6/2000 | Ella ........................... 333/189 |
| 6,201,457 | B1 | * | 3/2001 | Hickernell ................... 333/193 |
| 6,262,637 | B1 |   | 7/2001 | Bradley et al. |

FOREIGN PATENT DOCUMENTS

| EP | 1058383 | 12/0000 |
| EP | 0962999 | 12/1999 |
| EP | 1 126 604 A2 * | 8/2001 |

* cited by examiner

*Primary Examiner*—Barbara Summons

(57) ABSTRACT

A duplexer (1) with two band-pass filters (5, 6) comprising film bulk acoustic wave resonators (FBAR) (8, 9, 10, 11, 12, 13) has an extra antiresonant circuit in order to block the transmission signal. It has an extra resonant circuit in order to allow the desired receive signal to pass. The antiresonant circuit comprises the first FBAR (11) and a parallel inductor (14). The resonant circuit comprises the first FBAR (11) and a series inductor (7).

12 Claims, 2 Drawing Sheets

DUPLEXER AND METHOD OF ISOLATING AN RX-BAND AND A TX-BAND

Figure 1:
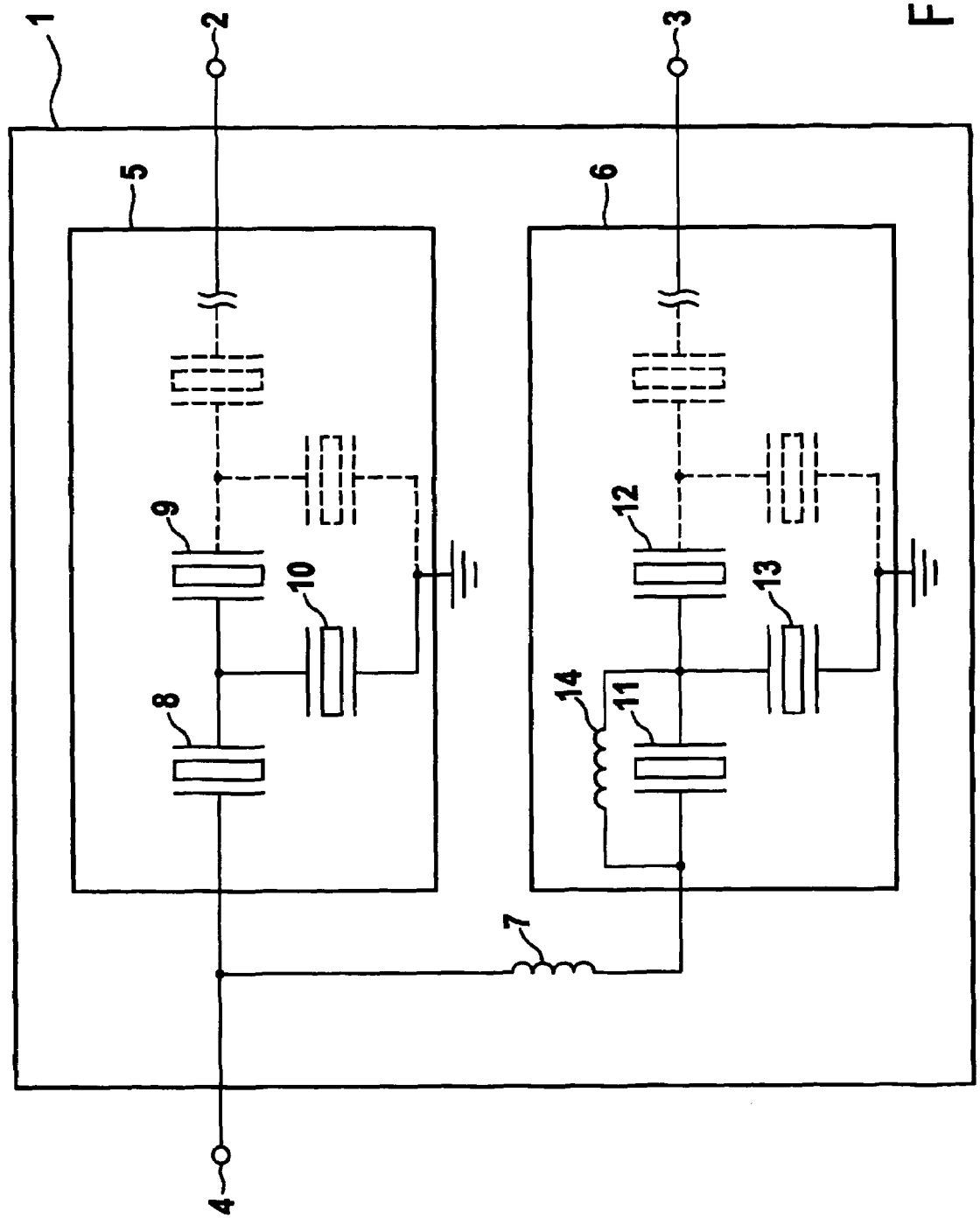

The invention relates to electronic devices enabling mobile communications or other wireless standards. In such systems band separating units are used to separate several bands. Examples thereof include duplexers, triplexers and multiplexers. The band separating unit may be used to separate various transmit bands, or various receive bands or several transmit and receive bands. For reasons of clarity the following discussion will focus on the duplexer separating a receive and a transmit band. However, this is not meant to be limiting.

A duplexer provides the necessary isolation between the receive and transmit bands. To avoid loading the Rx-filter on the Tx-filter in this duplexer a 90° phase shifter is used to transform the low impedance of the Rx-filter in the Tx-band to high impedance. The Rx-filter therefore acts as an open circuit in the Tx-band and does not load or influence the behavior of the Tx-filter. The 90° phase shifter can be implemented as lumped inductors and capacitors or as a $\lambda/4$-transmission line. Well-known practical examples are the HPMD-7904 and HPMD-7905 duplexers in which the 90° phase shifter is implemented as a $\lambda/4$-transmission line.

The invention also applies to front-end modules used for the reception in multi-band 'phones where the different bands are separated by filtering. In these front-end modules the different Rx-filters can be a load to each other. Different topologies can be conceived to avoid this loading. Essentially however, they can all be considered filter networks.

EP-A2 0 962 999 relates to resonator structures of radio communication apparatus. At least one resonator structure and one switch structure of this radio communication apparatus is manufactured on the same substrate during the same process. When using bridge type bulk acoustic wave (BAW) resonators and micro-mechanical switches the same process steps as those used for creating the bridge structures can be used to create the micro-mechanical switch structure. The integration of switch structures and resonators on the same substrate allows the manufacture of the very compact filter and resonator structures needed for multi-system mobile communication means. According to EP-A2 0 962 999 BAW resonators can be integrated on substrates, which are commonly used for active circuitry, such as silicon and gallium arsenide surfaces, wherein the switches are realized by transistor structures using, for example, MESFET transistors.

U.S. Pat. No. 6,262,637 B1 discloses an FBAR-based duplexer that comprises a first port, a second port, a third port, a first band-pass filter connected between the first port and the third port and a series arrangement connected between the second port and the third port. The first band-pass filter includes a ladder circuit having shunt and series elements. Each of the elements of the first ladder circuit comprises a film bulk acoustic resonator (FBAR). The series arrangement includes a 90° phase shifter in series with a second band-pass filter. The second band-pass filter includes a second ladder circuit having shunt and series elements. Each of the elements of the second ladder circuit comprises a film bulk acoustic resonator. A band-pass filter comprising shunt elements and series elements in which the series elements and the shunt elements are connected to form a ladder circuit, and each of the elements includes a film bulk acoustic resonator (FBAR). The 90° phase shifter may comprise of lumped inductors and capacitors or a $\lambda/4$-transmission line. The use of integrated FBAR areas comprising a number of interconnected FBARs fabricated on a common piezoelectric layer as the transmit FBAR area and the receive FBAR area enables the fabrication of very small duplexer embodiments.

The main drawbacks of known devices is the size of the elements needed to tune the bulk-acoustic wave resonators in the filter. Generally, $\lambda/4$-transmission lines are used as 90° phase shifter. These striplines have a very large size, which places severe constraints on the overall size of the filter and duplexer in particular, and the electromagnetic coupling of the $\lambda/4$-transmission with the rest of the circuitry, which contributes significantly to the stop band behavior.

Thus, to fulfill the requirements of continuing miniaturization, one object of the invention is to provide an electronic device with a band separating unit that is small, can withstand high power levels and has sufficiently steep filter characteristics to create a narrow stop band. Another object of the invention is to provide a method of isolating an Rx-band and a Tx-band.

The invention provides an electronic device comprising a band separating unit with a first port, a second port and an antenna port. A first band-pass filter connects herein the first port and the antenna port. A series arrangement connects the second port and the antenna port. This series arrangement comprises a second band-pass filter that includes a ladder circuit with shunt and series elements, of which series elements at least a first element comprises a film bulk acoustic wave resonator (FBAR). The device of the invention is herein characterized in that the first element of the second band-pass filter has a parallel inductor, and in that the series arrangement comprises a frequency tuning element between the antenna port and the second band-pass filter.

In the invention use is made of an element in the second band to block the first band. A frequency tuning element is provided to open the second band at the desired frequency spectrum. The first band is herein understood to mean the connection between the antenna port and the first port via the first band-pass filter. The second band is herein understood to mean the series arrangement between the antenna port and the second port. This element is the combined block of a bulk acoustic wave filter and a parallel inductor. This will be further explained.

A normal bulk acoustic wave resonator has both a resonant and an antiresonant frequency. The resonator's resonance is its frequency of minimum impedance and its antiresonance is its frequency of maximum impedance. The parallel inductor of the inventive duplexer, together with the static capacitance of its bulk acoustic resonator, forms a quasi extra antiresonant circuitry in the first band, e.g. that band located between the first port and antenna. Thus it forms a shunt LC network. This extra antiresonant circuit is preferably tuned to correspond to the center frequency of the first band and thus acts as an open circuit in order to block that band.

As a result of the inventive arrangement of the invention, there is no need to use phase shifters such as $\lambda/4$ transmission lines between the second band-pass filter and the antenna port. A frequency tuning element is sufficient.

In a preferred embodiment, the frequency tuning element is a series inductor. The series inductor, together with the static capacitance of the first element of the second band-pass filter, forms a resonant circuit in the second band. This resonant circuit is preferably tuned to correspond to the center frequency of the second band. The series inductor adds the resonant frequency of the second band to the bulk acoustic wave resonator in order to allow the desired second band to pass. This resonant frequency is also included in the first band. In general, the series inductor is preferred. However, with higher frequencies, a well-chosen interconnect may have the same function. Alternatively, particularly for a band-separating unit with more than two bands, other filters, such as high- or low-pass filters may be used instead of the series inductor.

In a further embodiment the band separating unit is a duplexer, wherein the first port is a transmit port and the second port is a receive port. The resulting duplexer is small and does not have the disadvantage of the electromagnetic coupling of the λ/4 transmission line to the rest of the circuitry. Besides, bands that lie apart by a small guard band only, can be separated as well. An important example hereof is the USPCS CDMA 1900 MHz system, with transmit bands from 1850–1910 MHz and receive bands from 1930–1990 MHz.

In another further embodiment, the band separating unit is a triplexer and the device is further provided with a third band-pass filter between the antenna port (4) and a third port, which third band-pass filter includes a ladder circuit with shunt and series elements, of which series elements at least a first element comprises a film bulk acoustic wave resonator (FBAR) and is provided with a parallel inductor, and wherein a further frequency tuning element is present between the antenna port (4) and the third band-pass filter. Tests have shown that the inventive arrangement can be applied with success in such a triplexer as well. This triplexer is for instance used to separate three bands within the GSM standard system. Herein the same constraints regarding size and functioning are present.

The first and second band pass filter preferably comprise ladder filters with shunt and series elements. In order to be able to integrate these into one band separating unit, it is preferred that for all shunt and series elements film bulk acoustic wave resonators are used. However, not necessarily, and discrete bulk acoustic wave resonators or discrete surface acoustic wave resonators can be applied alternatively. BAWs can be used as modulators for both amplification and phase modulated systems in smaller and increasingly complicated handheld units and demonstrate a good tolerance of high power levels. The desired support of several different standards and telecommunication systems requires several sets of filters and other radio frequency (RF) components. Surface acoustic wave (SAW) resonators are very small in size but cannot withstand the same high power levels as BAW. Besides, the frequency range wherein BAW-resonators can be used, extends higher frequencies (10–100 GHz instead of 2–3 GHz) too much.

The invention is however applicable to lattice filters as well. In this case, the ladder circuit of the second band pass filter comprises the first element, its parallel inductor and one shunt element. The lattice filter is then provided in a series arrangement between this ladder circuit and the second port.

The bulk acoustic wave resonators are preferably made according to silicon technology. These silicon dice (2 dice for a duplexer, 3 dice for a multi-band phone) are mounted on a substrate carrier where they are wire-bound or flip chipped. This is usually a cheap technology such as FR4 or any other multi-layer laminate technology, such as LTCC (Low Temperature Coefficient Ceramics) for example. The inductors are integrated on the substrate carrier.

It is also feasible for the parallel inductor to be integrated in the bulk acoustic wave resonator.

It is advantageous that the substrate carrier comprises further electrical elements, and particularly that it constitutes a front-end module comprising at least one amplifier. The front-end module can be sold as a complete building block to telephone manufacturers, but also to customers that do not have RF knowledge and nevertheless desire to integrate RF functionality into an apparatus, such as a car. Generally such front-end modules comprise a power amplifier and/or a low-noise amplifier and one or more impedance matching network. By further preference more power amplifiers and low noise amplifiers are present, e.g. for each band an amplifier. Further on, an antenna and a transceiver IC as well as a voltage-controlled oscillator may be part hereof.

The inventive duplexer may for example be used in a USPCS CDMA 1900 MHz system, in a 2 GHz, 2.5 GHz or 3 GHz system or in a multi-band 'phone, that includes, for instance a W-Lan or Bluetooth band.

The invention also provides a method. Devices of the personal communication system (PCS) that use Code Division Multiple Access (CDMA) operate in frequency bands of approximately 1,900 MHz. The guard band between the portions of the spectrum assigned to the transmit signal and the receive signal amounts to only approximately 1% of the carrier frequency, i.e. 20 MHz. The bandwidth of the portions of the spectrum assigned to the transmit signal and the receive signal amount to approximately 3% of the carrier frequency, i.e. 60 MHz. This means that the center frequencies of the Rx-band and Tx-bands are 40 MHz above and below the carrier frequency.

Figure 2:
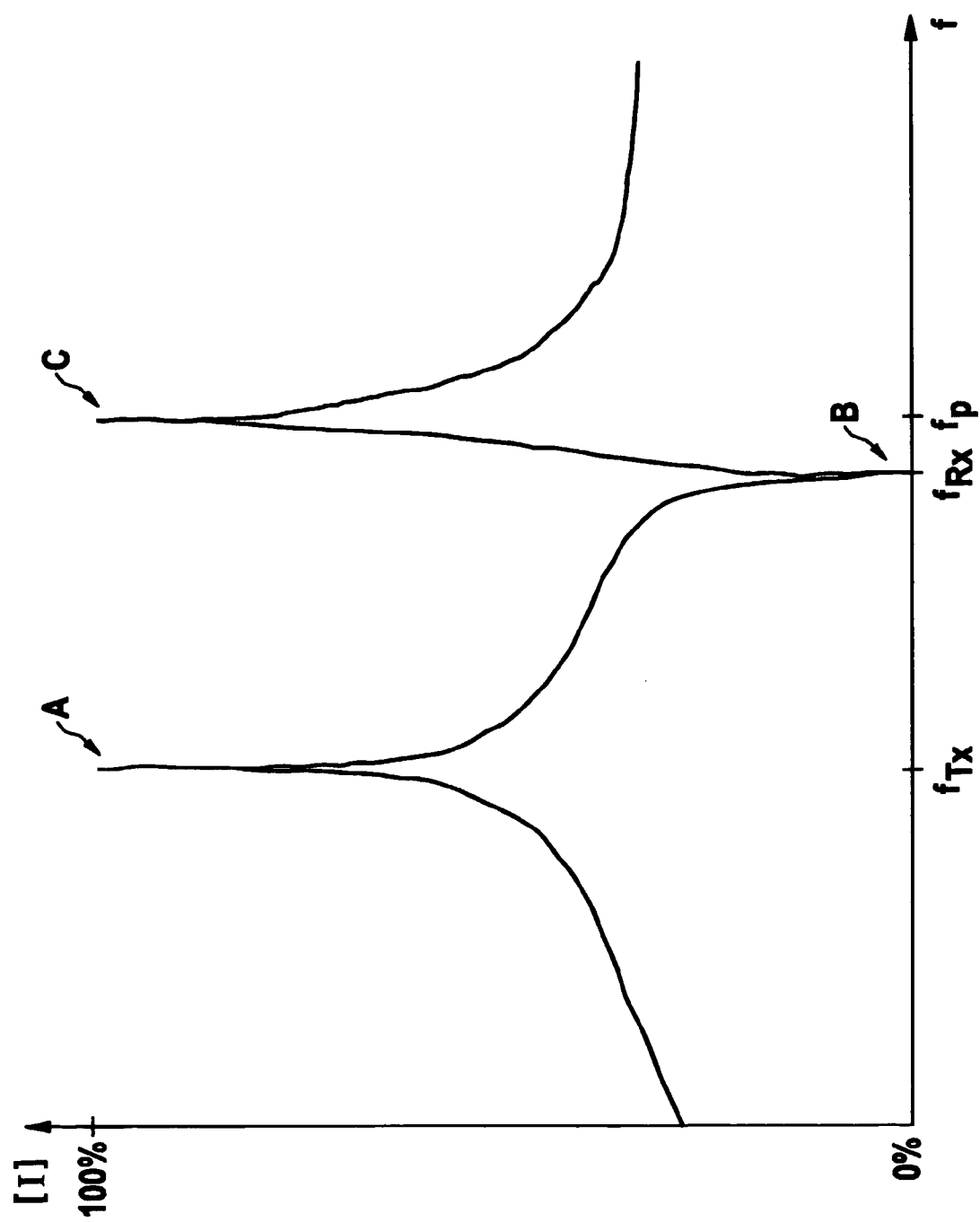

These and other aspects of the invention will become apparent from and will be elucidated with reference to the embodiments described hereinafter, where FIG. 1 is a block diagram illustrating an inventive duplexer, FIG. 2 is a graph illustrating the impedance of the series arrangement of the duplexer.

FIG. 1 is a block diagram illustrating an inventive duplexer 1 comprising a transmit port 2, a receive port 3 and an antenna port 4, a first band-pass filter 5 connecting the transmit port 2 and the antenna port 4, and a series arrangement connecting receive port 3 and antenna port 4, wherein the series arrangement comprises a second band-pass filter 6 and a series inductor 7. The transmit port 2 may be connected to the output of a transmit apparatus (not shown), the receive port 3 to the output of a receive apparatus (not shown) and the antenna port 4 to an antenna (not shown). The transmit/receive apparatus and the antenna may be part of a communications means such as a cellular phone or any other means which uses a duplexer with two filters. The first band-pass filter 5 including a first ladder circuit has shunt 10 and series elements 8, 9, the second band-pass filter 6 including a second ladder circuit also has shunt 13 and series 11, 12 elements, wherein the elements 8, 9, 10, 11, 12 and 13 of both the first and the second band-pass filter 5, 6 comprise a film bulk acoustic wave resonator (FBAR). The second ladder circuit resonator 11 connected to the series inductor 7 has a parallel inductor 14. The antiresonant circuit is constituted by the first FBAR 11 of the second band-pass filter 6 and forms an open circuit in the Rx-filter in the Tx-band. Thus, in effect, the open circuit causes the Tx-filter not to see the Rx-filter in the Tx-band. The number of elements required in the branches is design-dependent. 3–5 branches are preferable.

FIG. 2 is a graph illustrating the impedance in % of the band-pass filter 6 of the duplexer series arrangement connecting receive port 3 and antenna port 4. The course of the graph pertaining to the first resonator 11 with inductor 14 is: capacitive impedance—high impedance (quasi-extra antiresonance in the Tx-band)—low impedance (series resonant frequency in the Rx-band)—high impedance (anti-resonant frequency stop band Rx)—capacitive impedance. The graph shows three characteristic points:
1. a first peak A of approximately 100% at the center frequency $f_{Tx}$ of the transmission band, i.e. the stop band,
2. a first minimum B of approximately 0% at the center frequency $F_{Rx}$ of the receive band, i.e. of the pass-band which is also the resonator 11 frequency of series resonance,
3. a second peak C of approximately 100% at the resonator 11 frequency of parallel resonance.

Maximum impedance A is achieved when the series arrangement of band-pass filter 6 is tuned to correspond to the center frequency $f_{Tx}$ of the transmission band, i.e. when the duplexer series arrangement acts as an open circuit. The peak A mainly derives from the capacitance of the resonator 11 together with the parallel inductor 14. The value of inductor 14 has to be carefully chosen in order to ensure that the open circuit occurs at the center frequency $f_{Tx}$ of the transmission band.

Minimum impedance B is achieved when the resonant circuit is tuned to correspond to the center frequency $f_{Rx}$ of the receive band. The minimum impedance B derives from the resonator 11 characteristic and is its frequency of series resonance. The second maximum impedance C derives from the resonator 11 characteristic and is its frequency of parallel resonance $f_p$.

The series inductor 7 influences and improves the roll-off of the filter.

The invention may be summarized as a band separating unit, preferably a duplexer 1, including two band-pass filters 5, 6 composed of film bulk acoustic wave resonators (FBAR) 8, 9, 10, 11, 12, 13 with an extra antiresonant circuit in order to block the transmission signal. It has an extra resonant circuit in order to allow the desired receive signal to pass. The antiresonant circuit comprises the first FBAR 11 and a parallel inductor 14. The resonant circuit preferably comprises of the first FBAR 11 and a series inductor 7.

The invention claimed is:
1. An electronic device, comprising a band separating unit for separating a transmission band and a receive band comprising:
  a first port, a second port and an antenna port;
  a first band-pass filter connecting the first port and the antenna port; and
  a series arrangement connecting the second port and the antenna port, the series arrangement comprising:
    a second band-pass filter that includes a ladder circuit with shunt and series elements, of which series elements at least a first element comprises a film bulk acoustic wave resonator (FBAR), the first element of the second band-pass filter having a parallel inductor; and
    a frequency tuning element coupled between the antenna port and the second band-pass filter:
    wherein the first element and the parallel inductor together form an antiresonant circuit that blocks the transmission band at the entrance of the second band-pass filter (6), as its antiresonant frequency corresponds to the center frequency $f_{Tx}$ of the transmission band, and the first element together with the frequency tuning element form a resonant circuit that allows the receive band to pass, as its resonant frequency corresponds to the center frequency $f_{Rx}$ of the receive band.

2. An electronic device as claimed in claim 1, characterized in that the frequency tuning element is a series inductor.

3. An electronic device as claimed in claim 2, characterized in that the series inductor, together with the static capacitance of the first element of the second band-pass filter, forms a resonant circuit in the receive band.

4. An electronic device as claimed in claim 3, characterized in that this resonant circuit is tuned to correspond to the center frequency of the receive band.

5. Use of an electronic device as claimed in claim 2 in a USPCS CDMA 1900 MHz system, in a 2 GHz, 2:5 GHz or 3 GHz system or a multi-band phone.

6. An electronic device as claimed in claim 1, characterized in that the band separating unit is a duplexer, wherein the first port is a transmit port and the second port is a receive port.

7. An electronic device as claimed in claim 1, characterized in that the parallel inductor, together with the static capacitance of the first element of the second band-pass filter, forms an antiresonant circuit in the transmission band.

8. An electronic device as claimed in claim 1 characterized in that this antiresonant circuit is tuned to correspond to the center frequency of the transmission band.

9. An electronic device as claimed in claim 1, characterized in that the band separating unit is a triplexer, and in that the device is further provided with a third band-pass filter between the antenna port and a third port, which third band-pass filter includes a ladder circuit with shunt and series elements, of which series elements at least a first element comprises a film bulk acoustic wave resonator and is provided with a parallel inductor, and wherein a further frequency tuning element is present between the antenna port and the third band-pass filter.

10. An electronic device as claimed in claim 1 characterized in that the parallel inductor is integrated in the bulk acoustic wave resonator.

11. An electronic device as claimed in claim 1, characterized in that the frequency tuning element comprises an inductor; the bulk acoustic wave resonators are provided in the form of silicon dice, and the inductors are integrated on a substrate carrier on which the silicon dice of the bulk acoustic wave resonators are also mounted.

12. Method of isolating an Rx-band and a Tx-band in a duplexer comprising a transmit port, a receive port and an antenna port, and a first baud-pass filter connecting the transmit port and the antenna port, wherein the first band-pass filter includes a first ladder circuit with shunt and series elements and a series arrangement connects the receive port and the antenna port, wherein the series arrangement comprises a second band-pass filter including a second ladder circuit with shunt and series elements, wherein the elements of both the first and the second band-pass filter comprise a film bulk acoustic wave resonator, the method being characterized in that an antiresonant circuit blocks the transmission band at the entrance of the second band-pass filter, as its antiresonant frequency corresponds to the center frequency $f_{Tx}$ of the transmission band and a resonant circuit allows the receive band to pass, as its resonant frequency corresponds to the center frequency $f_{Rx}$ of the receive band.

* * * * *